United States Patent
Chen et al.

(10) Patent No.: US 10,217,749 B2
(45) Date of Patent: Feb. 26, 2019

(54) MANUFACTURING METHOD OF SEMICONDUCTOR MEMORY DEVICE

(71) Applicants: UNITED MICROELECTRONICS CORP., Hsin-Chu (TW); Fujian Jinhua Integrated Circuit Co., Ltd., Quanzhou, Fujian Province (CN)

(72) Inventors: Yu-Ching Chen, Kaohsiung (TW); Shih-Fang Tzou, Tainan (TW); Kuei-Hsuan Yu, New Taipei (TW); Hui-Ling Chuang, Changhua County (TW)

(73) Assignees: UNITED MICROELECTRONICS CORP., Hsin-Chu (TW); Fujian Jinhua Integrated Circuit Co., Ltd., Quanzhou, Fujian Province (CN)

( * ) Notice: Subject to any disclaimer, the term of this patent is extended or adjusted under 35 U.S.C. 154(b) by 0 days.

(21) Appl. No.: 15/894,947

(22) Filed: Feb. 13, 2018

(65) Prior Publication Data

US 2018/0254277 A1    Sep. 6, 2018

(30) Foreign Application Priority Data

Mar. 1, 2017    (CN) .......................... 2017 1 0116637

(51) Int. Cl.
*H01L 27/108* (2006.01)
*H01L 21/311* (2006.01)

(52) U.S. Cl.
CPC .. *H01L 27/10847* (2013.01); *H01L 27/10823* (2013.01); *H01L 27/10894* (2013.01); *H01L 27/10897* (2013.01); *H01L 21/31111* (2013.01); *H01L 21/31116* (2013.01); *H01L 21/31144* (2013.01); *H01L 27/10885* (2013.01)

(58) Field of Classification Search
CPC ......... H01L 27/10847; H01L 27/10897; H01L 27/10823; H01L 21/31116; H01L 21/31144; H01L 21/31111; H01L 21/0217; H01L 21/0228; H01L 21/28123; H01L 21/31051; H01L 27/10894; H01L 27/10885; H01L 29/4983; H01L 29/518; H01L 29/6653; H01L 29/6656
See application file for complete search history.

(56) References Cited

U.S. PATENT DOCUMENTS

2016/0163708 A1    6/2016  Jang
2016/0181143 A1*   6/2016  Kwon ................. H01L 27/1052
                                                          438/586

* cited by examiner

*Primary Examiner* — Thanh T Nguyen
(74) *Attorney, Agent, or Firm* — Winston Hsu

(57) ABSTRACT

A manufacturing method of a semiconductor memory device includes the following steps. A semiconductor substrate having a memory cell region and a peripheral region defined thereon is provided. Bit line structures are formed on the memory cell region. At least one gate structure is formed on the peripheral region. A spacer layer is formed covering the semiconductor substrate, the gate structure, and the bit line structures. The spacer layer is partly disposed on the memory cell region and partly disposed on the peripheral region. A first etching process is performed to the spacer layer for removing a part of the spacer layer on the memory cell region. At least a part of the spacer layer remains on the memory cell region after the first etching process. A second etching process is performed after the first etching process for removing the spacer layer remaining on the memory cell region.

10 Claims, 6 Drawing Sheets

MANUFACTURING METHOD OF SEMICONDUCTOR MEMORY DEVICE

BACKGROUND OF THE INVENTION

1. Field of the Invention

The present invention relates to a manufacturing method of a semiconductor memory device, and more particularly, to a manufacturing method of a semiconductor memory device including two etching processes for removing a spacer layer on a memory cell region of the semiconductor memory device.

2. Description of the Prior Art

Dynamic random access memory (DRAM) is a kind of volatile storage device which is an indispensable key part of many electronic products. DRAM includes a great number of memory cells arranged for forming an array configured to store data. Each of the memory cells may be composed of a metal oxide semiconductor (MOS) transistor and a capacitor connected in series.

The MOS transistors in the memory cells may have different structural design because of the product specification and/or the memory cell density requirements. Therefore, the structure of the MOS transistor in the memory cell may be different from that of transistors on other regions within the same chip, and the manufacturing process will become more complicated. Accordingly, it is very important for the related field to effectively integrate the manufacturing process of the memory cell and the manufacturing process of the devices in other regions.

SUMMARY OF THE INVENTION

A manufacturing method of a semiconductor memory device is provided in the present invention. Two etching processes are used to remove a spacer layer on a memory cell region of the semiconductor memory device. Problems such as too much etchant required, longer etching time, and worse side etching uniformity when a single wet etching process is used to remove the spacer layer may by improved accordingly.

According to an embodiment of the present invention, a manufacturing method of a semiconductor memory device is provided. The manufacturing method includes the following steps. A semiconductor substrate is provided. The semiconductor substrate has a memory cell region and a peripheral region defined thereon. Bit line structures are formed on the memory cell region. At least one gate structure is formed on the peripheral region. A spacer layer is formed covering the semiconductor substrate, the gate structure, and the bit line structures. The spacer layer is partly disposed on the memory cell region and partly disposed on the peripheral region. A first etching process is performed to the spacer layer for removing a part of the spacer layer on the memory cell region. At least a part of the spacer layer remains on the memory cell region after the first etching process. A second etching process is performed after the first etching process for removing the spacer layer remaining on the memory cell region.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIGS. 1-6 are schematic drawings illustrating a manufacturing method of a semiconductor memory device according to an embodiment of the present invention, wherein FIG. 2 is a cross-sectional diagram of bit line structures under the condition of FIG. 1, FIG. 3 is a schematic drawing in a step subsequent to FIG. 1, FIG. 4 is a cross-sectional diagram of the bit line structures under the condition of FIG. 3, FIG. 5 is a schematic drawing in a step subsequent to FIG. 3, and FIG. 6 is a cross-sectional diagram of the bit line structures under the condition of FIG. 5.

DETAILED DESCRIPTION

Figure 1:
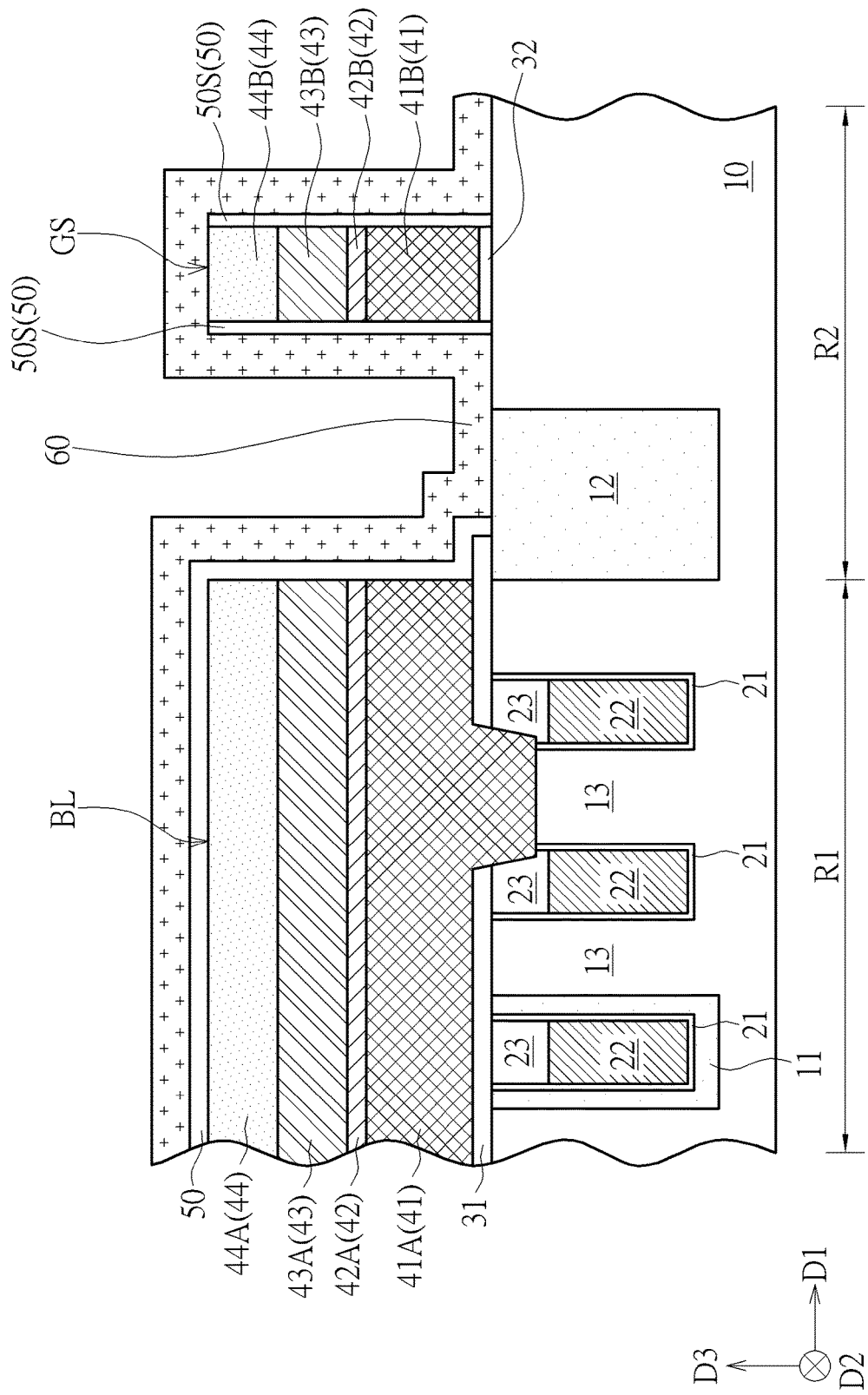
Figure 2:
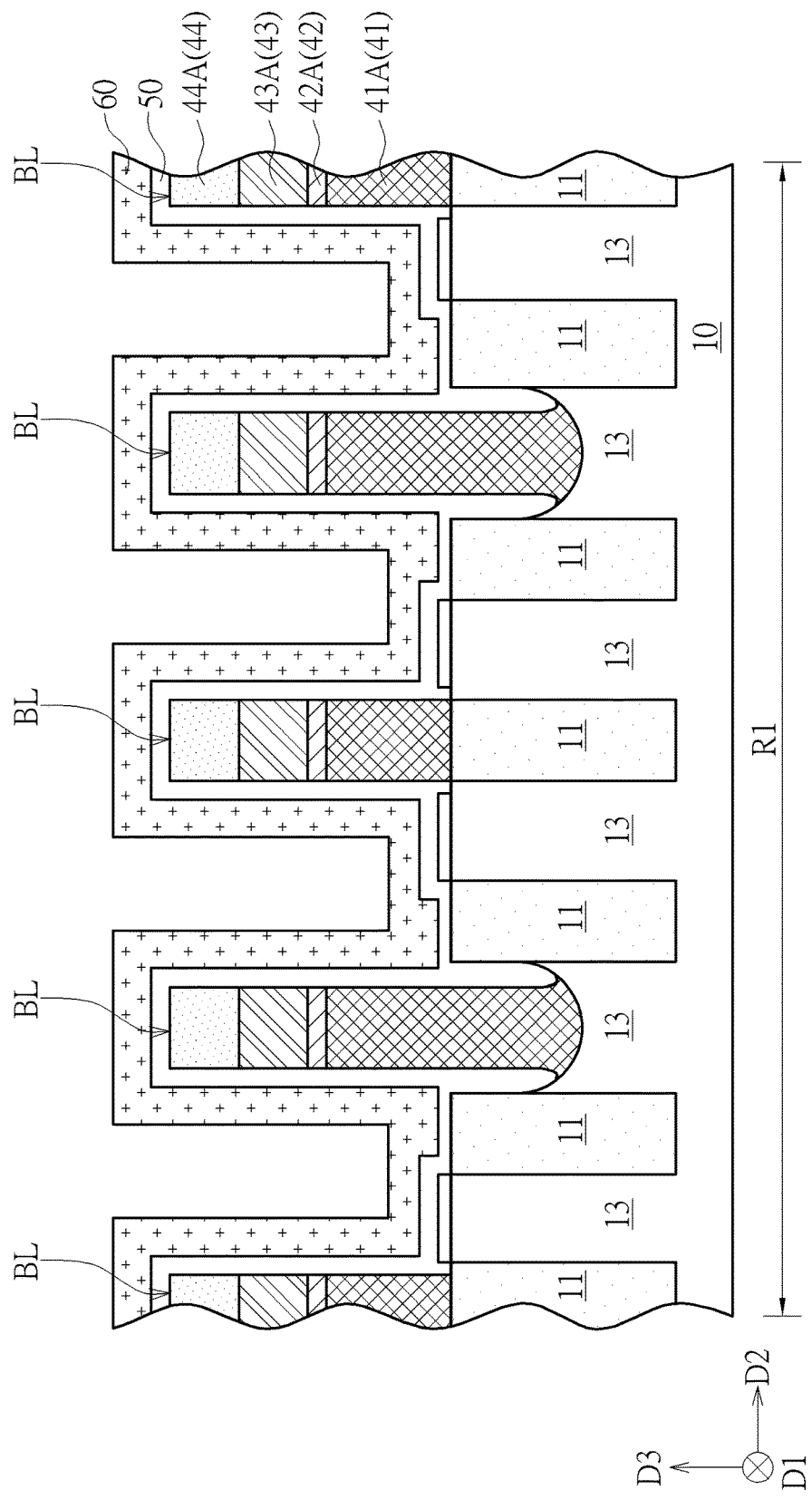
Figure 3:
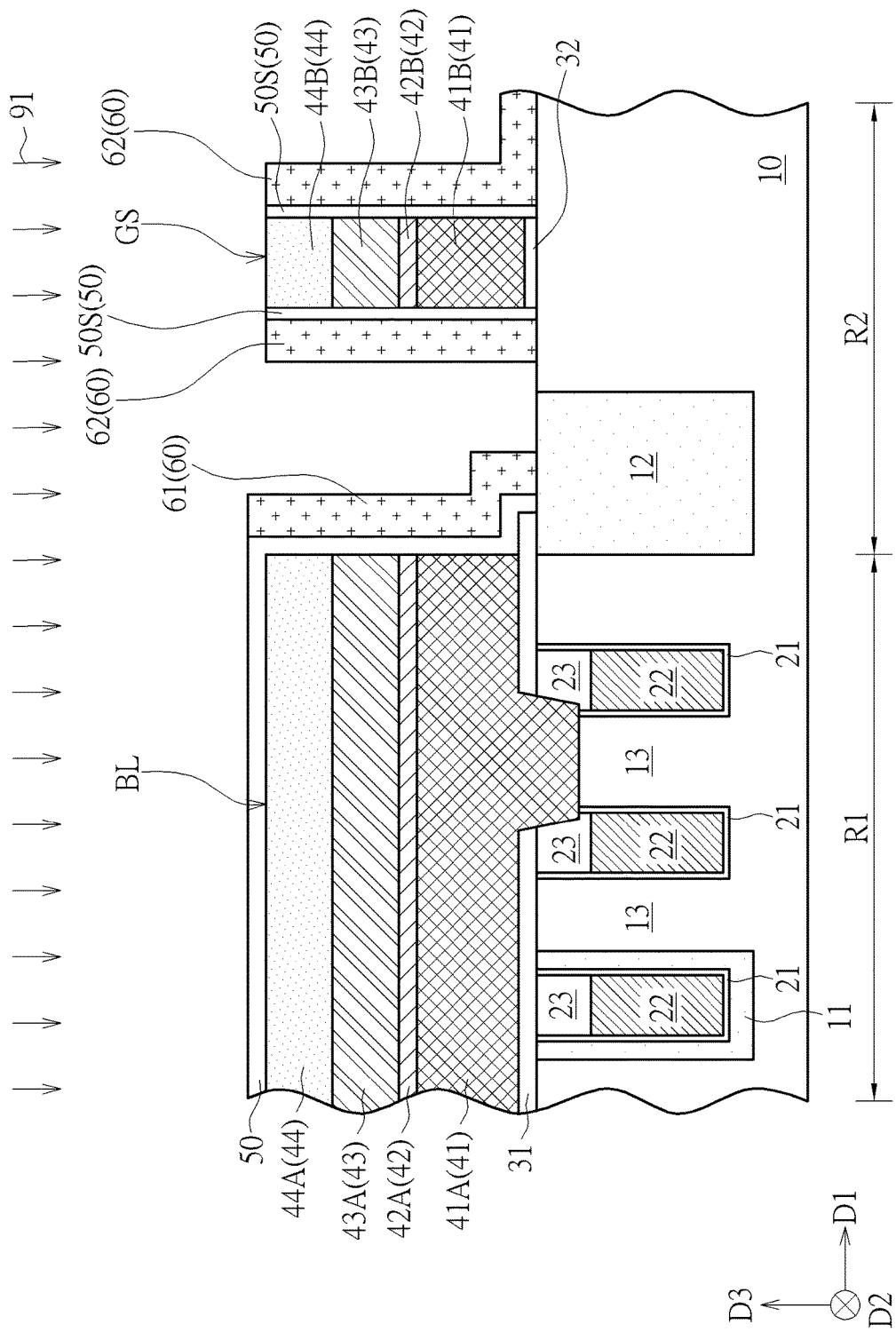
Figure 4:
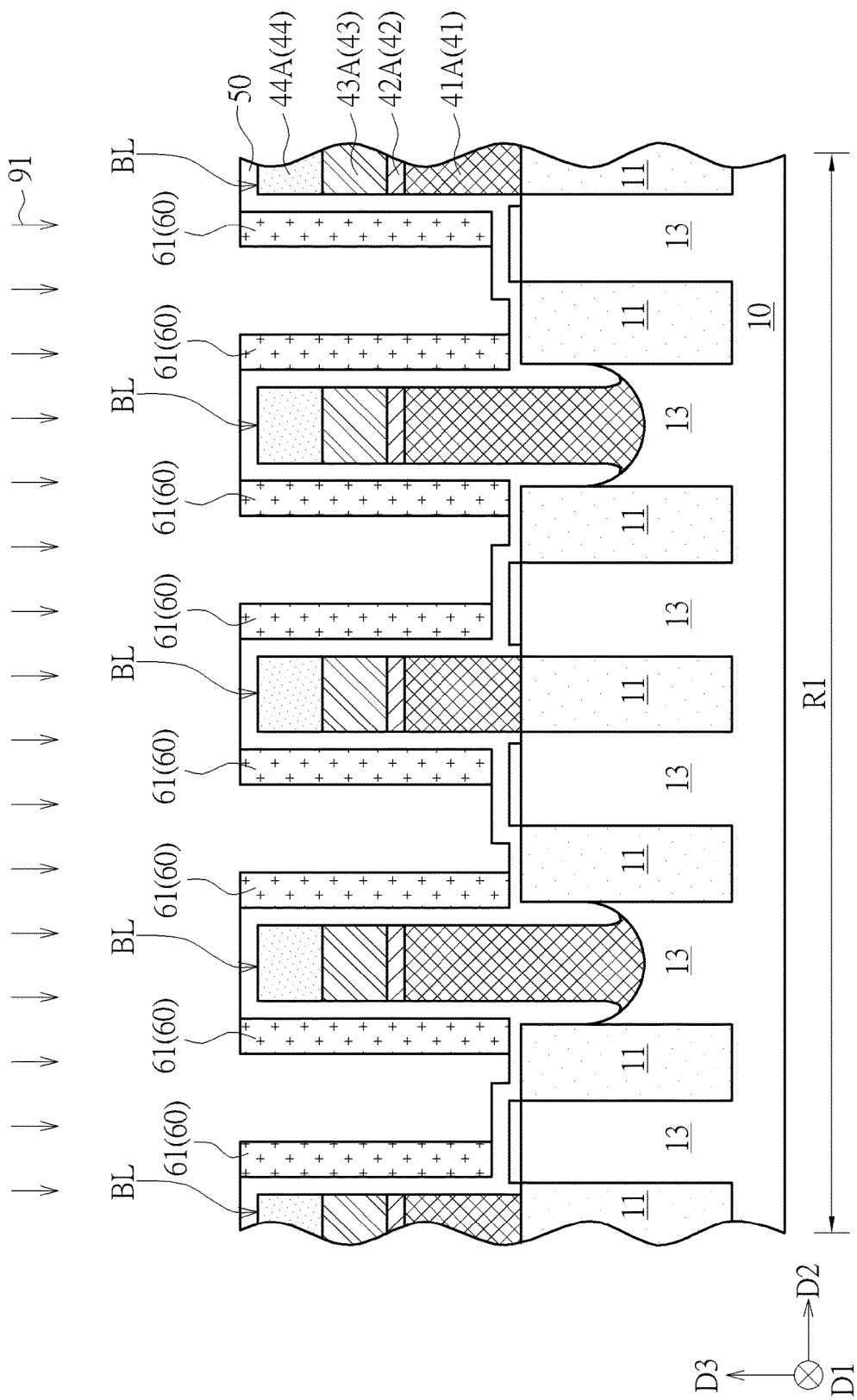
Figure 5:
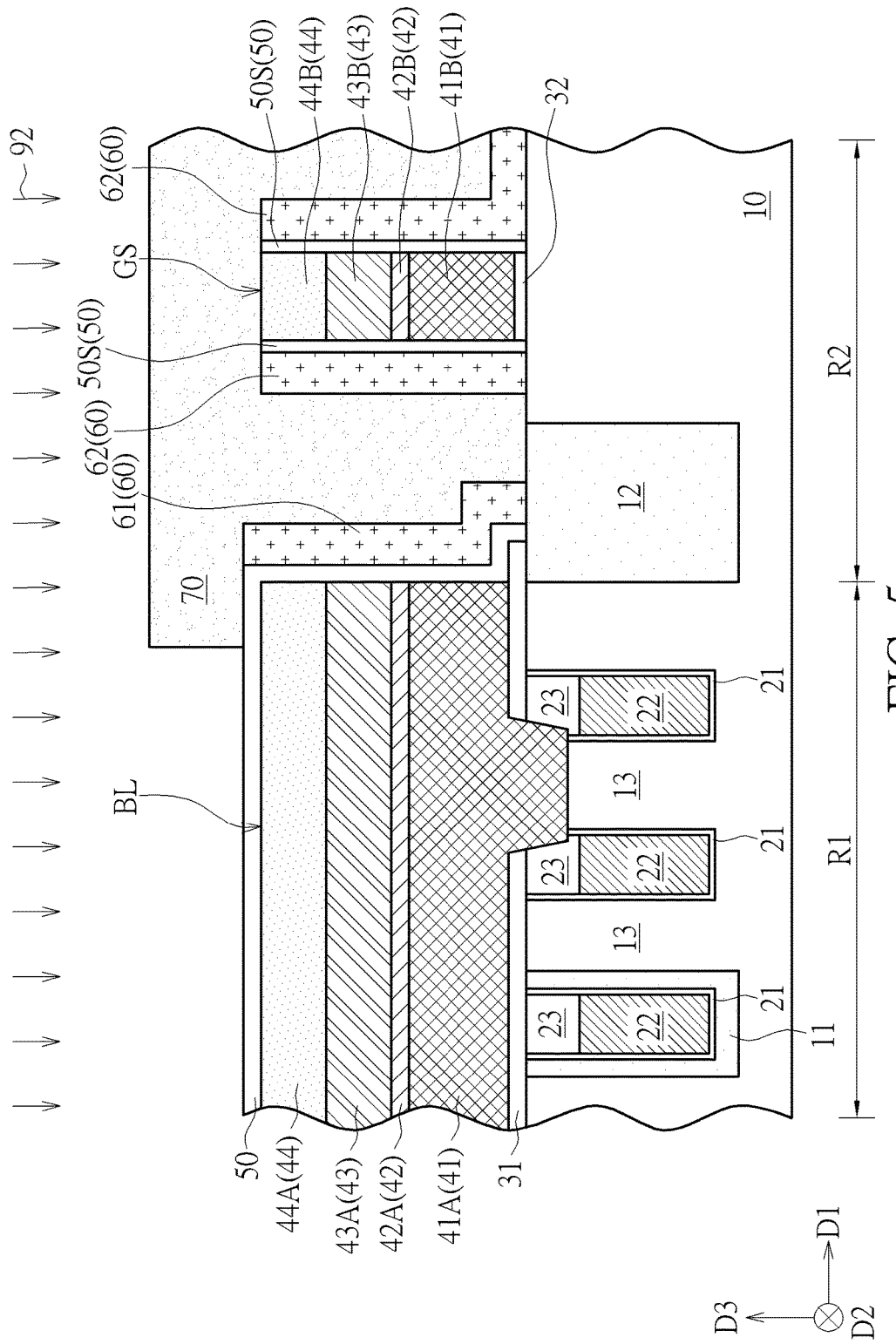
Figure 6:
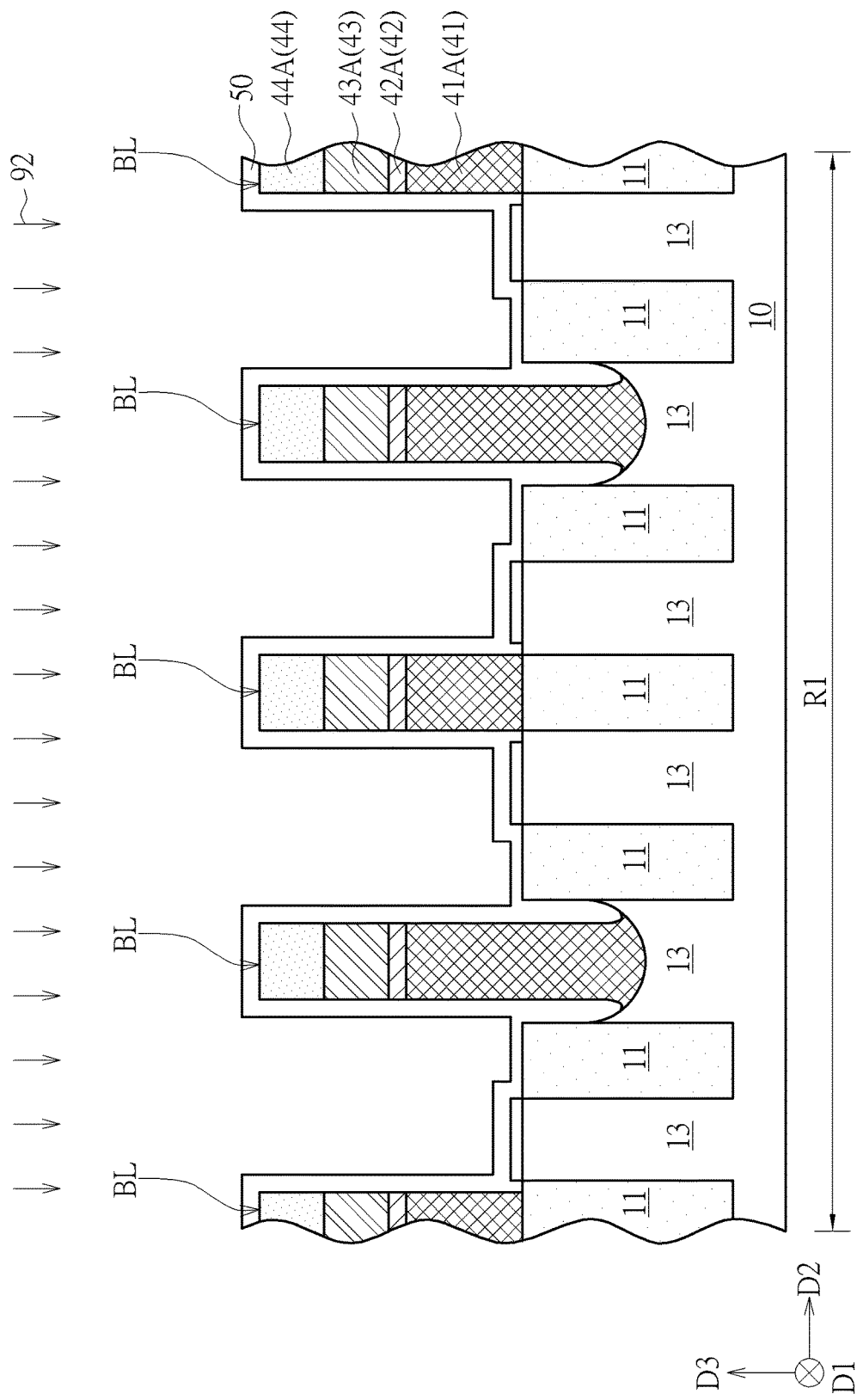

Please refer to FIGS. 1-6. FIGS. 1-6 are schematic drawings illustrating a manufacturing method of a semiconductor memory device according to an embodiment of the present invention. FIG. 1, FIG. 3, and FIG. 5 are cross-sectional diagrams of a memory cell region and a peripheral region. FIG. 2, FIG. 4, and FIG. 6 are cross-sectional diagrams of bit line structures. The manufacturing method of the semiconductor memory device is provided in this embodiment and includes the following steps. Firstly, as shown in FIG. 1 and FIG. 2, a semiconductor substrate 10 is provided. The semiconductor substrate 10 has a memory cell region R1 and a peripheral region R2 defined thereon. A plurality of memory cells may be formed in the memory cell region R1, and other units, such as transistors controlling transmission of word line signals and/or bit line signals, apart from the memory cells may be formed in the peripheral region R2, but not limited thereto. The semiconductor substrate 10 may include a silicon substrate, an epitaxial silicon substrate, a silicon germanium substrate, a silicon carbide substrate, or a silicon-on-insulator (SOI) substrate, but not limited thereto. In this embodiment, a shallow trench isolation 11 may be formed in the memory cell region R1 of the semiconductor substrate 10 for defining a plurality of active region 13, and a trench isolation 12 may be formed in the semiconductor substrate 10 for providing an isolation effect between the memory cell region R1 and the peripheral region R2. The shallow trench isolation 11 and the trench isolation 12 may be formed by forming trenches in the semiconductor substrate 10 by etching and filling the trenches with insulation materials such as silicon oxide, but not limited thereto. In some embodiments, the shallow trench isolation 11 and the trench isolation 12 may also be formed by other suitable approaches according to other considerations. Additionally, a plurality of word lines 22 maybe formed in the memory cell region R1 of the semiconductor substrate 10, and the word lines 22 in this embodiment may be buried word lines, but not limited thereto. The word lines 22 may be formed and buried in the semiconductor substrate 10 and the shallow trench isolation 11. A word line dielectric layer 21 may be formed between each of the word lines 22 and the semiconductor substrate 10, and a word line cap layer 23 may be formed on each of the word lines 22 and cover the word line 22. The word line dielectric layers 21, the word lines 22, and the word line cap layers 23 may be formed by forming a plurality of trenches in the semiconductor substrate 10 and the shallow trench isolation 11, and the word line dielectric layers 21, the word lines 22, and the word line cap layers 23 maybe sequentially formed in the trenches, but not limited thereto. In some embodiments, the word line dielectric layer 21 may include silicon oxide or other suitable dielectric materials, the word line 22 may include aluminum (Al), tungsten (W), copper (Cu), titanium aluminide (TiAl), or other suitable conductive materials, and the word line cap layer 23 may include silicon nitride, silicon oxynitride, silicon carbonitride, or other suitable insulation materials.

Subsequently, as shown in FIG. 1 and FIG. 2, bit line structures BL are formed on the memory cell region R1 of the semiconductor substrate 10, and at least one gate structure GS is formed on the peripheral region R2 of the semiconductor substrate 10. Each of the bit line structures BL is elongated in a first direction D1, and the bit line structures BL may be repeatedly arranged in the second direction D2. Additionally, each of the bit line structures BL may be extended to be partially disposed on the peripheral region R2, but not limited thereto.

In some embodiments, the bit line structures BL and the gate structure GS may be formed in the memory cell region R1 and the peripheral region R2 respectively by patterning a stacked structure including multiple layers, but the present invention is not limited to this. The bit line structures BL and the gate structure GS may also be formed by different processes and/or different materials according to other considerations. For instance, a stacked structure including a non-metal conductive layer 41, a barrier layer 42, a metal layer 43, and a cap layer 44 stacked sequentially may be formed on the semiconductor substrate 10, and the stacked structure may be patterned to become the bit line structures BL and the gate structure GS. The non-metal conductive layer 41 may include polysilicon, amorphous silicon, or other non-metal conductive layer including silicon or not. The barrier layer 42 may include titanium, tungsten silicide (WSi), tungsten nitride (WN), or other appropriate barrier materials. The metal layer 43 may include aluminum, tungsten, copper, titanium aluminide, or other suitable metal conductive materials with low electrical resistivity. The cap layer 44 may include silicon nitride, silicon oxynitride, silicon carbonitride, or other suitable insulation materials. Accordingly, each of the bit line structures BL may include a first non-metal conductive layer 41A, a first barrier layer 42A, a first metal layer 43A, and a bit line cap layer 44A stacked sequentially, and the gate structure GS may include a second non-metal conductive layer 41B, a second barrier layer 42B, a second metal layer 43B, and a gate cap layer 44B, but not limited thereto. Additionally, before the step of forming the stacked structure mentioned above, an insulation layer 31 may be formed on the memory cell region R1 of the semiconductor substrate 10 and cover the word line cap layer 23, the shallow trench isolation 11, and the active areas 13, and an active region opening may be formed penetrating the insulation layer 31 and exposing a part of the active region 13. The stacked structure mentioned above may be formed on the insulation layer 31 and in the active region opening, and the bit line structures BL subsequently formed may contact and be electrically connected with the corresponding active region 13. Additionally, a gate dielectric layer 32 may be formed between the gate structure GS and the semiconductor substrate 10 in the peripheral region R2 for being used as a gate dielectric layer in a transistor corresponding to the gate structure GS, but not limited thereto.

Subsequently, a spacer layer 60 is formed on the semiconductor substrate 10 and covers the semiconductor substrate 10, the gate structure GS, and the bit line structures BL. The spacer layer 60 is partly disposed on the memory cell region R1 and partly disposed on the peripheral region R2. The spacer layer 60 is used to form a sidewall spacer on the sidewalls of the gate structure GS, and the material of the spacer layer 60 may include silicon oxide, silicon nitride, silicon oxynitride, or other suitable dielectric materials. In some embodiments, a dielectric layer 50 may be formed covering the bit line structures BL before the step of forming the spacer layer 60. Higher etching selectivity may exist between the dielectric layer 50 and the spacer layer 60 preferably. For example, the dielectric layer 50 may be a silicon nitride layer, and the spacer layer 60 may be a silicon oxide layer, but not limited thereto. In some embodiments, the dielectric layer may also be formed by other suitable dielectric materials different from the spacer layer 60. Additionally, in some embodiments, the dielectric layer 50 may be further formed on the peripheral region R2, and the manufacturing method of the semiconductor memory device may further include etching the dielectric layer 50 formed on the peripheral region R2 for forming a first spacer 50S on the sidewalls of the gate structure GS. In some embodiments, the spacer layer 60 may be formed after the step of forming the first spacer 50S, and the spacer layer 60 may further cover the first spacer 50S, but not limited thereto.

As shown in FIG. 3 and FIG. 4, a first etching process 91 is performed to the spacer layer 60 for removing a part of the spacer layer 60 on the memory cell region R1, and at least a part of the spacer layer 60 remains on the memory cell region R1 after the first etching process 91. The first etching process 91 may include an anisotropic etching process, such as a dry etching process, but not limited thereto. In some embodiments, the first etching process 91 may include an etching back process for removing the spacer layer 60 covering the gate structure GS and the bit line structures BL in a vertical direction D3 perpendicular to the semiconductor substrate 10. The first etching process 91 may be stopped at the dielectric layer 50 because of the higher etching selectivity between the spacer layer 60 and the dielectric layer 50, and the dielectric layer 50 may be regarded as an etching stop layer in the first etching process 91, but not limited thereto. In other words, the dielectric layer 50 formed on the bit line structures BL in the vertical direction D3 is covered by the spacer layer 60 before the first etching process 91, and the dielectric layer 50 formed on the bit line structures BL in the vertical direction D3 is exposed after the first etching process 91. Additionally, the spacer layer 60 on the peripheral region R2 is partially removed by the first etching process 91 to become a second spacer 62 on the sidewalls of the gate structure GS, and the first spacer 50S is located between the second spacer 62 and the gate structure GS. Additionally, in some embodiments, the spacer layer 60 on the memory cell region R1 is partially removed by the first etching process 91 to become third spacers 61 on sidewalls of the bit line structures BL. In other words, the spacer layer 60 remaining on the memory cell region R1 after the first etching process 91 may include at least a part of the third spacers 61.

Subsequently, as shown in FIG. 5 and FIG. 6, a second etching process 92 is performed after the first etching process described above for removing the spacer layer 60 remaining on the memory cell region R1. In some embodiments, a patterned mask layer 70 may be formed covering the gate structure GS, the first spacer 50S, and the second spacer 62 on the peripheral region R2 after the first etching process described above and before the second etching process 92. The gate structure GS, the first spacer 50S, and the second spacer 62 on the peripheral region R2 are covered by the patterned mask layer 70 during the second etching process 92. In other words, the spacer layer 60 on the memory cell region R1 is not covered by the patterned mask layer 70 and is exposed during the second etching process 92, and the exposed spacer layer 60 on the memory cell region R1 is similar to the condition shown in FIG. 4. As shown in FIG. 4 and FIG. 6, at least a part of the third spacers 61 are removed by the second etching process 92. It is worth noting that the first etching process described above is different from the second etching process 92 preferably. For example, the first etching process may include an anisotropic etching process such as a dry etching process, and the second etching process 92 may include an isotropic etching process such as a wet etching process, but not limited thereto. In some embodiments, when the spacer layer 60 is an oxide layer, the second etching process 92 may include a wet etching process using hydrogen fluoride (HF) or a buffer oxide etchant (BOE) composed of hydrogen fluoride and ammonium fluoride (NH$_4$F), but not limited thereto. In some embodiments, the second etching process 92 may include other etching approaches and/or other etchants according to the materials of the spacer layer 60 and the dielectric layer 50. Compared with the method using a single wet etching process to remove the spacer layer 60 on the memory cell region R1, the first etching process is performed before the second etching process 92 for partially remove the spacer layer 60 on the memory cell region R1. The etchant consumption and the etching time of the second etching process 92 may be reduced, and the etching uniformity of the spacer layer 60 influenced by the side etching variation in the second etching process 92 maybe improved accordingly. That is helpful to manufacturing cost reduction and manufacturing yield enhancement.

To summarize the above descriptions, according to the manufacturing method of the semiconductor memory device in the present invention, two different etching process are used to remove the spacer layer on the memory cell region of the semiconductor memory device. The problems such as too much etchant consumption, longer etching time, and worse side etching uniformity when the single wet etching process is used to remove the spacer layer may by improved accordingly.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A manufacturing method of a semiconductor memory device, comprising:
   providing a semiconductor substrate having a memory cell region and a peripheral region defined thereon;
   forming bit line structures on the memory cell region;
   forming at least one gate structure on the peripheral region;
   forming a spacer layer covering the semiconductor substrate, the gate structure, and the bit line structures, wherein the spacer layer is partly disposed on the memory cell region and partly disposed on the peripheral region;
   performing a first etching process to the spacer layer for removing a part of the spacer layer on the memory cell region, wherein at least a part of the spacer layer remains on the memory cell region after the first etching process; and
   performing a second etching process after the first etching process for removing the spacer layer remaining on the memory cell region, wherein the first etching process is different from the second etching process, the first etching process comprises an anisotropic etching process, and the second etching process comprises an isotropic etching process.

2. The manufacturing method of the semiconductor memory device according to claim 1, wherein the spacer layer covering the gate structure and the bit line structures in a vertical direction perpendicular to the semiconductor substrate is removed by the first etching process.

3. The manufacturing method of the semiconductor memory device according to claim 2, further comprising:
   forming a dielectric layer covering the bit line structures before the step of forming the spacer layer, wherein the first etching process is stopped at the dielectric layer.

4. The manufacturing method of the semiconductor memory device according to claim 3, wherein the dielectric layer formed on the bit line structures in the vertical direction is covered by the spacer layer before the first etching process, and the dielectric layer formed on the bit line structures in the vertical direction is exposed after the first etching process.

5. The manufacturing method of the semiconductor memory device according to claim 3, wherein the dielectric layer is further formed on the peripheral region, and the manufacturing method of the semiconductor memory device further comprises:
   etching the dielectric layer formed on the peripheral region for forming a first spacer on sidewalls of the gate structure.

6. The manufacturing method of the semiconductor memory device according to claim 2, wherein the spacer layer on the peripheral region is partially removed by the first etching process to become a second spacer on sidewalls of the gate structure.

7. The manufacturing method of the semiconductor memory device according to claim 6, further comprising:
   forming a patterned mask layer covering the gate structure and the second spacer on the peripheral region after the first etching process and before the second etching process, wherein the gate structure and the second spacer on the peripheral region are covered by the patterned mask layer during the second etching process.

8. The manufacturing method of the semiconductor memory device according to claim 7, wherein the spacer layer on the memory cell region is not covered by the patterned mask layer during the second etching process.

9. The manufacturing method of the semiconductor memory device according to claim 2, wherein the spacer layer on the memory cell region is partially removed by the first etching process to become third spacers on sidewalls of the bit line structures.

10. The manufacturing method of the semiconductor memory device according to claim 9, wherein at least a part of the third spacers are removed by the second etching process.

* * * * *